(12) United States Patent
Nishimura et al.

(10) Patent No.: US 7,170,348 B2
(45) Date of Patent: Jan. 30, 2007

(54) DIFFERENTIAL AMPLIFYING CIRCUIT

(75) Inventors: Kouichi Nishimura, Kanagawa (JP); Atsushi Shimatani, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 9 days.

(21) Appl. No.: 10/975,935

(22) Filed: Oct. 29, 2004

(65) Prior Publication Data

US 2005/0093629 A1    May 5, 2005

(30) Foreign Application Priority Data

Oct. 31, 2003    (JP)    ............................. 2003-373638

(51) Int. Cl.
*H03F 3/45*    (2006.01)
(52) U.S. Cl. ........................ 330/253; 330/257; 330/260
(58) Field of Classification Search ................ 330/147, 330/253, 257, 260
See application file for complete search history.

(56) References Cited

U.S. PATENT DOCUMENTS 6,614,295 B2* 9/2003 Tsuchi ......................... 327/563
6,642,787 B1* 11/2003 Souetinov et al. .......... 330/252
6,657,486 B2* 12/2003 Kimura ....................... 327/563
6,977,549 B2* 12/2005 Tsuchi ......................... 330/257

FOREIGN PATENT DOCUMENTS

| JP | 2001-34234 A | 2/2001 |
| JP | 2001-313568 A | 11/2001 |
| JP | 2001-343948 A | 12/2001 |

* cited by examiner

*Primary Examiner*—Patricia Nguyen
(74) *Attorney, Agent, or Firm*—Sughrue Mion, PLLC

(57) ABSTRACT

A differential amplifier circuit includes a first differential transistor pair, a second differential transistor pair, an adder section and an amplifying unit. The first differential transistor pair receives first and second input signals and an output signal as a third input signal, and the second differential transistor pair receives the first and second input signals and the output signal as a fourth input signal. The adder section adds first output signals from the first differential transistor pair and second output signals from the second differential transistor pair, and the amplifying unit amplifies an addition resultant signal from the adder section to output to the first and second differential transistor pairs.

17 Claims, 9 Drawing Sheets

DIFFERENTIAL AMPLIFYING CIRCUIT

BACKGROUND OF THE INVENTION

1. Field of the Invention

The present invention relates to a differential amplifier. More specifically, the present invention is directed to a differential amplifier used in an amplifying circuit of an LCD driver for driving a capacitive load.

2. Description of the Related Art

Nowadays, there is a trend that higher gradation is strongly required in a TFT-LCD (Thin-Film Transistor Liquid Crystal Display) field. That is to say, conventionally, 260,000-color display (64 gradation levels in 6 bits) sufficiently satisfied requirements of the TFT-LCD field. However, currently, 16,780,000-color display (256 gradation levels in 8 bits) is requested in the TFT-LCD field. Moreover, display of 1,024 gradation levels in 10 bits is requested depending on fields. For instance, such a higher gradation display is requested for X-ray image display in a medical field and TV display field. When such a higher gradation display is achieved, an LCD driver circuit becomes more complicated. For example, such a LCD driver is disclosed in Japanese Laid Open Patent Application (JP-P2001-34234A). In this LCD driver, furthermore, a chip area of the driver circuit is increased, resulting in higher cost.

FIG. 1 is a block diagram showing a partial circuit of a conventional LCD driver in which operational amplifiers having two non-inversion inputs are used. Referring now to FIG. 1, the conventional LCD driver is composed of a latch address selector 101, a latch circuit 102, n (n is an integer more than 1) decoders 103, and n operational amplifiers 104. Each of these operational amplifiers 104 has two non-inversion inputs, and constitutes a voltage follower circuit.

Input data D0 to D8 corresponding to 8-bit display data are supplied to the latch circuit 102. Outputs of the latch circuit 102 are supplied to the respective decoders 103. Each of these decoders 103 has two voltage output terminals (Vin1 and Vin2). Voltage outputs (Vin1/Vin2) from the two voltage output terminals of each decoder 103 are supplied to a corresponding one of the operational amplifiers 104. In this circuit, 8-bit 256-gradation voltages are not supplied to one decoder 103, but 129-gradation (=256/2+1) voltages are supplied to the decoder 103. A voltage between the adjacent two voltages is interpolated by the operational amplifiers 104, and 8-bit 256-gradation voltages are outputted as a final output from the operational amplifiers 104.

FIG. 2 is a diagram showing a specific circuit arrangement of one operational amplifier 104 having two non-inversion inputs shown in FIG. 1. Referring to FIG. 2, in the operational amplifier 104, two MOS transistors on an input side are grouped, and one output (Vout) is generated to the two input voltages (Vin1, Vin2). The output voltage (Vout) is $V_2$ in case where the input voltages (Vin1 and Vin2) are equal to a same gradation voltage (for instance, Vin1=Vin2=$V_2$). In case where the input voltages (Vin1 and Vin2) are adjacent gradation voltages (for instance, Vin1=$V_0$ and Vin2=$V_2$), the output (Vout) is substantially equal to an intermediate voltage $V_1$ obtained by combining $V_0$ with $V_2$.

In the 2-input amplifier employed in the conventional driver circuit as shown in FIG. 2, when a difference between the two input voltages Vin1 and Vin2 is relatively small, the output voltage (Vout) is obtained as follows:

$$V\text{out}=(V\text{in}1+V\text{in}2)/2.$$

However, when a difference between the two input voltages becomes large, a deviation from (Vin1+Vin2)/2 becomes larger.

Thus, a high precision driver circuit is desirable without requiring a complex circuit arrangement.

In conjunction with the above description, an interpolation type D-A converter is disclosed in Japanese Laid Open Patent Application (JP-P2001-313568A, see FIG. 10 of this conventional example). This conventional example is used for a TFT LCD driver which is composed of a reference voltage generation circuit which generates a plurality of reference voltages. At least one decoding switch receives the plurality of reference voltages from the reference voltage generation circuit and selects two of the plurality of reference voltages based on a plurality of high bits of a digital image signal. A routing switch is connected with the decoding switch and generates first and second reference voltages based a plurality of low bits of the digital image signal. An interpolation buffer is connected with the routing switch and generates an interpolation analog signal based on the first and second reference voltages.

Also, a driver circuit is disclosed in Japanese Laid Open Patent Application (JP-P2001-343948A). In this conventional example, a gradation voltage generating circuit generates a plurality of gradation voltages which are different in voltage level from each other. A decoder decodes an input data and selects first and second gradation voltages from the plurality of gradation voltages based on the decoding result. An amplifier generates a drive voltage based on the first and second gradation voltages. The amplifier is composed of a first transistor for a differential pair, a second transistor connected with the first transistor for the differential pair, a third transistor connected in parallel to the second transistor, and a switch circuit. The switch circuit carries out a switching operation in a predetermined period between a first state in which the first gradation voltage is transferred to the first transistor and the second gradation voltage is transferred to the second transistor, and a second state in which the second gradation voltage is transferred to the first transistor and the first gradation voltage is transferred to the second transistor.

SUMMARY OF THE INVENTION

An object of the present invention is to provide a high-precision LCD driver circuit with a simple circuit arrangement.

Another object of the present invention is to provide an operational amplifier having two input terminals, and capable of correctly outputting an averaged voltage of two different voltages which are supplied to the two input terminals.

In an aspect of the present invention, a differential amplifier circuit includes a first differential transistor pair, a second differential transistor pair, an adder section and an amplifying unit. The first differential transistor pair receives first and second input signals and an output signal as a third input signal, and the second differential transistor pair receives the first and second input signals and the output signal as a fourth input signal. The adder section adds first output signals from the first differential transistor pair and second output signals from the second differential transistor pair, and the amplifying unit amplifies an addition resultant signal from the adder section to output to the first and second differential transistor pairs.

Here, the first differential transistor pair may include first and second P-channel transistors having sources which are commonly connected, gates which respectively receive the first and second input signals, and drains which are commonly connected; and third and fourth P-channel transistors having sources which are commonly connected with the sources of the first and second P-channel transistors, gates which commonly receive the output signal, and drains which are commonly connected. The second differential transistor pair may include fifth and sixth N-channel transistors having source which are commonly connected, gates which respectively receive the first and second input signals, and drains which are commonly connected; and seventh and eighth N-channel transistors having sources which are commonly connected with the sources of the fifth and sixth N-channel transistors, gates which commonly receive the output signal, and drains which are commonly connected. The first output signals are respectively outputted from the drains of the first and second P-channel transistors and the drains of the third and fourth P-channel transistors, and the second output signals are respectively outputted from the drains of the fifth and sixth N-channel transistors and the drains of the seventh and eighth N-channel transistors.

In this case, the adder section may include first to third current mirror circuit. The first current mirror circuit is connected with the first differential transistor pair to receive the first output signals; and the second current mirror circuit is connected with the second differential transistor pair and outputs one of the second output signals to one of transistors of the first current mirror circuit. The third current mirror circuit is connected with the second differential transistor pair and outputs the other of the second output signals to the other of the transistors of the first current mirror circuit.

Also, the differential amplifier may further include first and second constant current sources. In this case, the first and second P-channel transistors are connected in parallel to each other and the sources of the first and second P-channel transistors are connected with the first constant current source, and the drains of the first and second P-channel transistors are commonly connected with one of transistors of the first current mirror circuit to output one of the first output signals to the one transistor of the first current mirror circuit. The third and fourth P-channel transistors are connected in parallel to each other and the sources of the third and fourth transistors are connected with the first constant current source, and the drains of the third and fourth transistors are commonly connected with the other of transistors of the first current mirror circuit to output the other of the first output signals to the other transistor of the first current mirror circuit. The fifth and sixth N-channel transistors are connected in parallel to each other and the source of the fifth and sixth N-channel transistors are connected with the second constant current source, and the drains of the fifth and sixth N-channel transistors are commonly connected with one of transistors of the second current mirror circuit. The seventh and eighth N-channel transistors are connected in parallel to each other and the sources of the seventh and eighth N-channel transistors are connected with the second constant current source, and the drains of the seventh and eighth N-channel transistors are commonly connected with one of transistors of the third current mirror circuit. One of the second output signals is supplied from the other transistor of the second current mirror circuit to the other transistor of the first current mirror circuit, and the other of the second output signals is supplied from the other transistor of the third current mirror circuit to the one transistor of the first current mirror circuit.

Also, the adder section may include fourth and fifth current mirror circuits and a floating constant current source section. The fourth current mirror circuit receives the second output signals, and the fifth current mirror circuit receives the first output signals. The floating constant current source section is connected between the fourth and fifth current mirror circuits. The amplifying unit is driven based on a third output signal from the fourth current mirror circuit and a fourth output signal from the fifth current mirror circuit to output the addition resultant signal.

In this case, each of the fourth and fifth current mirror circuits may be of a cascode connection type.

Also, the floating constant current source section may include a first current source section which comprises a P-channel MOS transistor and an N-channel MOS transistor which are connected in parallel and is connected between one side of the fourth current mirror circuit and one side of the fifth current mirror circuit; and a second current source section which comprises a P-channel MOS transistor and an N-channel MOS transistor which are connected in parallel and is connected between the other side of the fourth current mirror circuit and the other side of the fifth current mirror circuit.

Also, the amplifying unit may include a P-channel MOS transistor and an N-channel MOS transistor which are connected in series. The P-channel MOS transistor and the N-channel MOS transistor of the output stage circuit receive as the addition resultant signal, the third output signal from the fourth current mirror circuit and the fourth output signal from the fifth current mirror circuit respectively, and the output signal is outputted from a node between the P-channel MOS transistor and the N-channel MOS transistor of the output stage circuit.

Also, the floating constant current source section may include a first current source section which comprises a P-channel MOS transistor and an N-channel MOS transistor which are connected in parallel and is connected between one side of the fourth current mirror circuit and one side of the fifth current mirror circuit.

In this case, the amplifying unit may include a P-channel MOS transistor and an N-channel MOS transistor which are connected in series. The P-channel MOS transistor and the N-channel MOS transistor of the output stage circuit receive as the addition resultant signal, the third output signal from the fourth current mirror circuit and the fourth output signal from the fifth current mirror circuit respectively, and the output signal is outputted from a node between the P-channel MOS transistor and the N-channel MOS transistor of the output stage circuit.

Also, a mobility of each of the first to fourth P-channel MOS transistors is $\mu_P$, and a mobility of each of the fifth to eighth N-channel MOS transistors is $\mu_N$, a ratio of a gate width W of each of the first to fourth P-channel MOS transistors to a gate length L thereof is:

$$\frac{W}{L}\bigg|_P$$

a ratio of a gate width W of each of the fifth to eighth N-channel MOS transistors to a gate length L thereof is:

$$\frac{W}{L}\bigg|_N$$

when a gate oxide film capacitance per unit area of each of the first to fourth P-channel MOS transistors and the fifth to eighth N-channel MOS transistors is $C_0$, $\beta_P$ and $\beta_N$ indicated by the following equations satisfy a relation of $\beta_P=\beta_N$:

$$\beta_P = \frac{W}{L}\bigg|_P \mu_P C_o$$

$$\beta_N = \frac{W}{L}\bigg|_N \mu_N C_o$$

DESCRIPTION OF THE PREFERRED EMBODIMENTS

Hereinafter, a differential amplifier of the present invention will be described in detail with reference to the attached drawings.

First Embodiment

Figure 1:
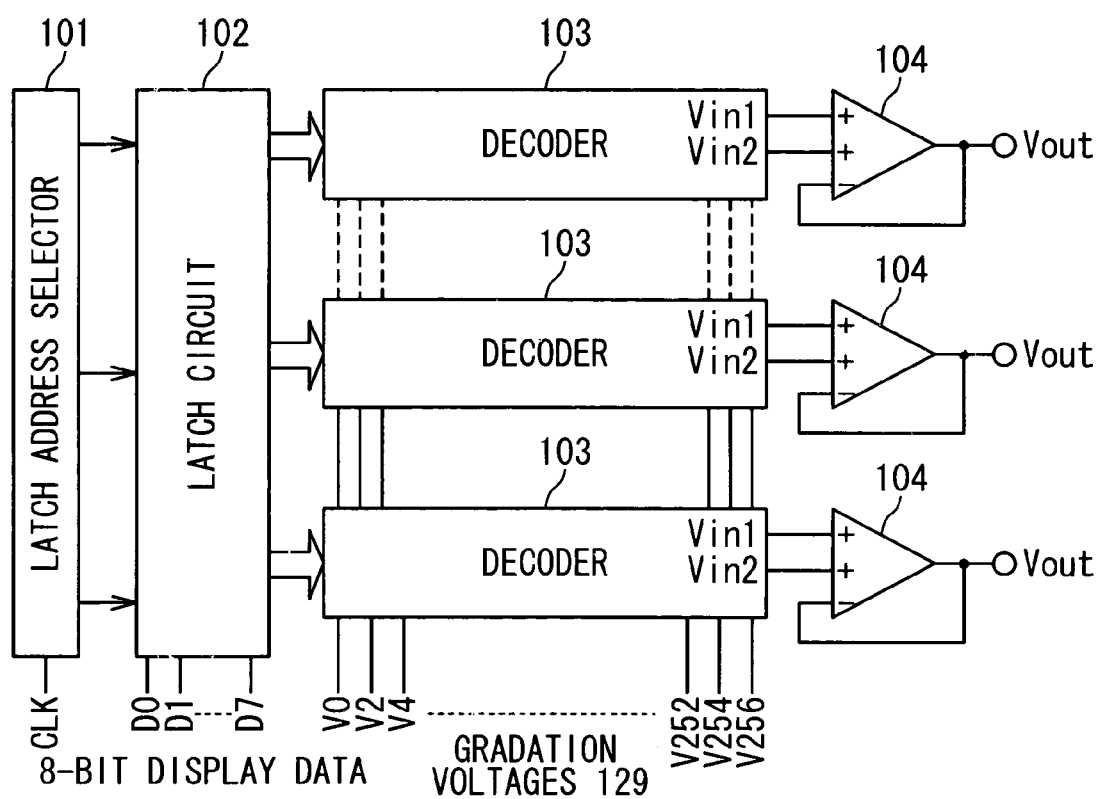
FIG. 1 is a schematic block diagram showing the circuit arrangement of a conventional LCD source driver.
Figure 2:
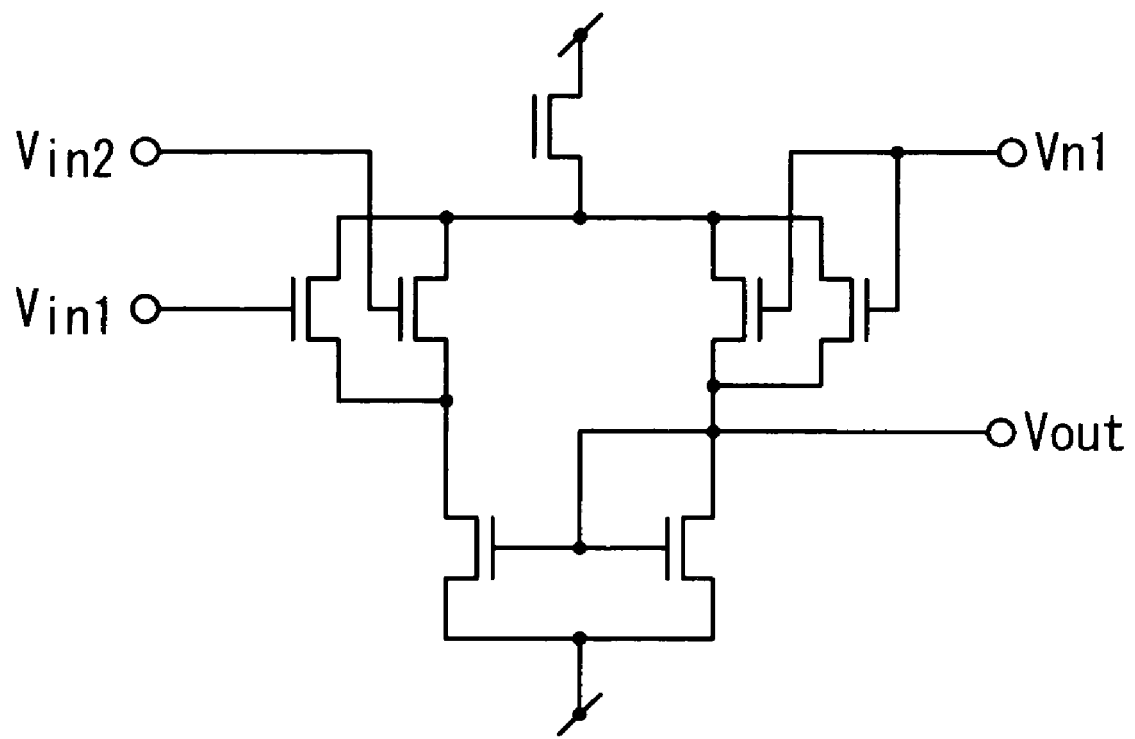
FIG. 2 is a diagram showing an example of a specific circuit of a conventional amplifier employed in the LCD source driver.
Figure 3:
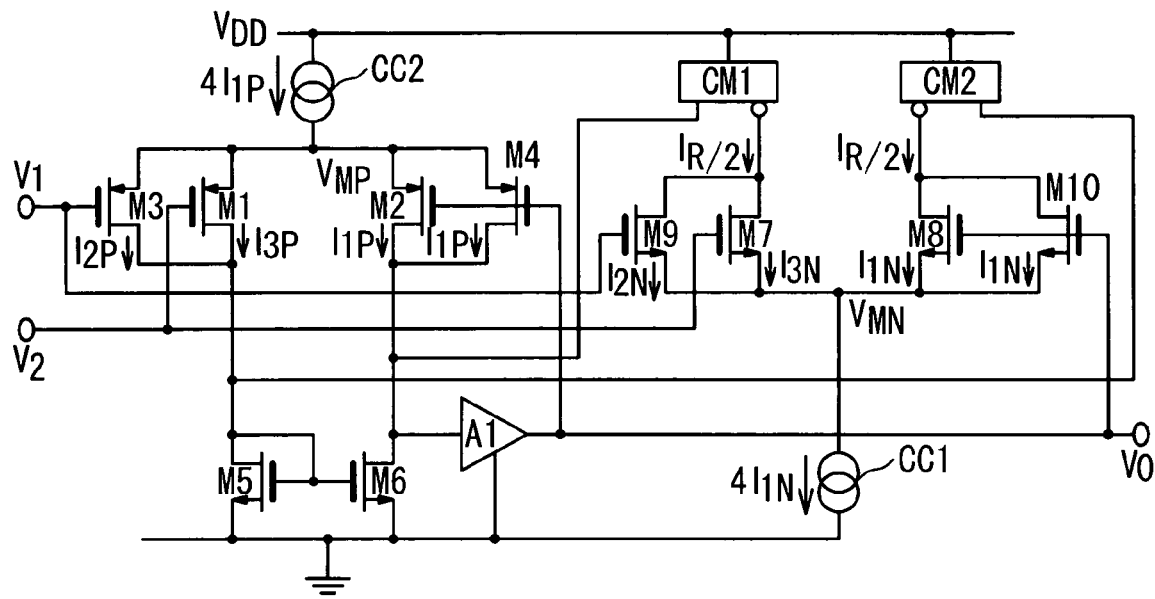
FIG. 3 is a circuit diagram showing a two-input amplifier according to a first embodiment of the present invention.
Figure 4:
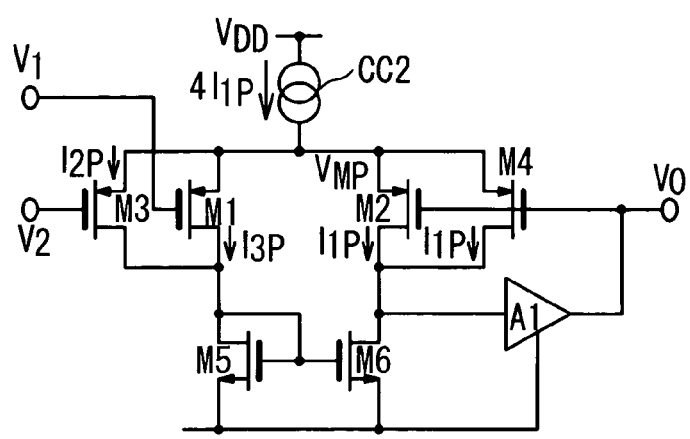
FIG. 4 is a diagram showing an example of a specific circuit of a differential stage employed in the 2-input amplifier of FIG. 3.
Figure 5:
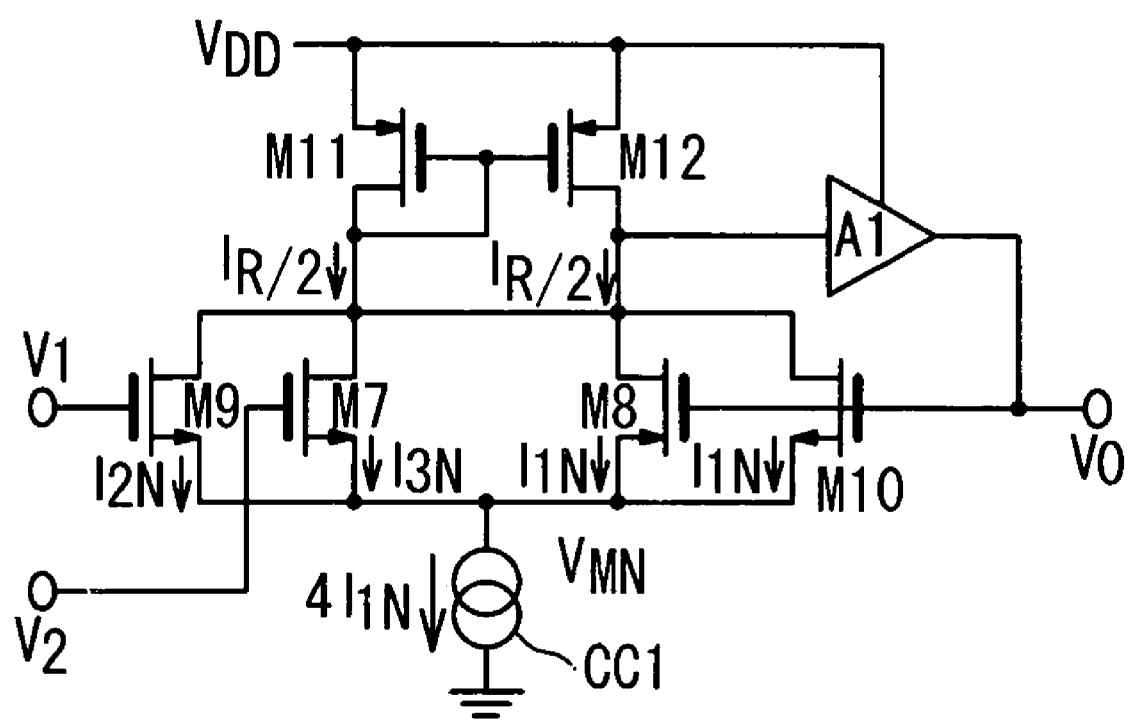
FIG. 5 is a diagram showing another example of a specific circuit of the differential stage employed in the 2-input amplifier of FIG. 3.

FIG. 3 is a diagram showing a circuit arrangement of an equivalent circuit of an operational amplifier having two inputs. FIG. 4 is a circuit diagram showing a specific circuit arrangement of a PMOS (P-channel MOS) transistor differential amplifier contained in the equivalent circuit shown in FIG. 3. FIG. 5 is a circuit diagram showing another specific circuit arrangement of an NMOS (N-channel MOS) transistor differential amplifier contained in the equivalent circuit shown in FIG. 3.

The operational amplifier shown in FIG. 3 is constituted by combining the PMOS transistor differential amplifier shown in FIG. 4 and the NMOS transistor differential amplifier shown in FIG. 5. In order to easily understand the present invention, the circuit arrangement and operation of each of the PMOS transistor differential amplifier and the NMOS transistor differential amplifier will be described. Further, an equivalent circuit arranged by combining the NMOS transistor differential amplifier and the PMOS transistor differential amplifier will be described.

Referring to FIG. 4, the PMOS transistor differential amplifier is composed of a source type constant current source CC2, PMOS transistors M1 to M4 and NMOS transistors M5 and M6, and an amplifying unit A1. The PMOS transistor M1 has the gate as a first input terminal, and the PMOS transistor M3 has the gate as a second input terminal. The PMOS transistor M2 has the gate as an inversion input terminal, and the PMOS transistor M4 has the gate as the inversion input terminal. The NMOS transistor M5 and the NMOS transistor M6 constitute a current mirror circuit functioning as an active load, and an input of the amplifying unit A1 is connected to an output of the active load. Furthermore, the gates of the PMOS transistor M2 and PMOS transistor M4 are connected with the output of the amplifying unit A1 to constitute a voltage follower connection.

More specifically, one terminal of the constant current source CC2 is connected to a power supply voltage $V_{DD}$, and this constant current source CC2 supplies a current IR. The other terminal of the constant current source CC2 is connected to the sources of the PMOS transistor M3 and M1. A first input voltage $V_1$ and a second input voltage $V_2$ are applied to the gate of the PMOS transistor M3, and the gate of the PMOS transistor M1, respectively. The drain of the PMOS transistor M3 and the drain of the PMOS transistor M1 are connected to the drain of the NMOS transistor M5. The NMOS transistor M5 constitutes a current mirror in combination with the NMOS transistor M6. The characteristics of the NMOS transistor M5 are supposed to be identical to those of the NMOS transistor M6. The source of the NMOS transistor M5 and the source of the NMOS transistor M6 are connected to a ground voltage. The gate of the NMOS transistor M5 and the gate of the NMOS transistor M6 are connected to each other, and are further connected to the drain of the NMOS transistor M5. The drain of the NMOS transistor M6 is connected to the drain of the PMOS transistor M2 and the drain of the PMOS transistor M4. The source of the PMOS transistor M2 and the source of the PMOS transistor M4 are connected to the constant current source CC2. The gate of the PMOS transistor M2 and the gate of the PMOS transistor M4 are connected to the output of the amplifying unit A1 as an output $V_o$.

Characteristics of the PMOS transistor M2 and the PMOS transistor M4 are supposed to be substantially same to those of the PMOS transistor M3 and the PMOS transistor M1. The output voltage $V_o$ of the PMOS transistor differential amplifier having such a circuit arrangement is in a range of the voltage $V_1$ and the voltage $(V_1+V_2)$. When the constant current source CC2 flows the current $I_R$, the PMOS transistor M1 and the PMOS transistor M3 flow a current $I_{2P}$ and a current $I_{3P}$ corresponding to the first input voltage $V_1$ and the second input voltage $V_2$, respectively. A summation of the current $I_{2P}$ and the current $I_{3P}$ is equivalent to a current $I_R/2$ and flows through the NMOS transistor M5. Since the NMOS transistor M5 and the NMOS transistor M6 have the same characteristics and constitute the current mirror circuit, the current $I_R/2$ flows through the NMOS transistor M6. The constant current source CC2 supplies the current $I_R/2$ to the source of the PMOS transistor M2 and the source of the PMOS transistor M4. If the PMOS transistor M2 and the PMOS transistor M4 have the same characteristics, a current $I_{1P}$ flows through the PMOS transistor M2 and the PMOS transistor M4. Also, if the summation between the current flowing through the PMOS transistor M2 and the current flowing through the PMOS transistor M4 is coincident with the summation between the current flowing through the PMOS transistor M3 and the current flowing through the PMOS transistor M1, the current I1 is coincident with an averaged current between the current I2 and the current I3. If the characteristics of the PMOS transistor M2 and the PMOS transistor M4 are coincident with the characteristics of the PMOS transistor M3 and the PMOS transistor M1, the voltage at the gates of the PMOS transistor M2 and M4 is substantially equal to the averaged voltage between the first input voltage $V_1$ and the second voltage $V_2$, namely, the in-phase voltage $((V_1+V_2)/2)$.

Assuming now that a voltage which is applied to one non-inversion input terminal is equal to $V_1$ and another voltage which is applied to the other non-inversion input terminal is equal to $V_2$, the in-phase voltage is correctly analyzed. In this case, a voltage $V_0$ which is finally outputted can be expressed as follows. That is, when $$\beta = \frac{W}{L} \mu C_o, \quad (1)$$

where $\mu$ is a mobility in an MOS transistor, W is a gate width of the MOS transistor, L is a gate length of the MOS transistor is L, CO is a gate oxide film capacitance, the finally outputted voltage $V_0$ is expressed by the following equation (2):

$$V_o = \frac{V_1 + V_2}{2} + \frac{-2\sqrt{\frac{2I_1}{\beta}} + \sqrt{\left(2\sqrt{\frac{2I_1}{\beta}}\right)^2 - (V_1 - V_2)^2}}{2} \quad (2)$$

where I1 is the current flowing through each of the PMOS transistor M2 and the PMOS transistor M4.

Referring to FIG. 5, similarly to the PMOS transistor differential amplifier shown in FIG. 4, the NMOS transistor differential amplifier is provided with a constant current source CC1 for supplying a current $I_R$, NMOS transistors M7 to M10, and PMOS transistors M11 and M12.

One terminal of the constant current source CC1 is connected to the ground voltage, and the constant current source CC1 supplies the current $I_R$ to the ground terminal. The other terminal of the constant current source CC1 is connected to the sources of the NMOS transistors M9 to M10. A first input voltage $V_1$ and a second input voltage $V_2$ are applied to the gate of the NMOS transistor M9 and the gate of the NMOS transistor M7, respectively. The drain of the NMOS transistor M9 and the drain of the NMOS transistor M7 are connected to the drain of the PMOS transistor M11. The PMOS transistor M11 constitutes a current mirror circuit together with the PMOS transistor M12. The characteristics of the PMOS transistor M11 are supposed to be identical to those of the PMOS transistor M12. The source of the PMOS transistor M11 and the source of the PMOS transistor M12 are connected to the power supply voltage $V_{DD}$. The gate of the PMOS transistor M11 and the gate of the PMOS transistor M12 are connected to each other, and are further connected to the drain of the PMOS transistor M11. The drain of the PMOS transistor M12 is connected to the drain of the NMOS transistor M8 and the drain of the NMOS transistor M10. The source of the NMOS transistor M8 and the source of the NMOS transistor M10 are connected to the constant current source CC1. An input of the amplifying unit A1 is connected with the drain of the PMOS transistor M12, and an output of the amplifying unit A1 is connected to the gate of the NMOS transistor M8 and the gate of the NMOS transistor M10 which are held to a same output voltage $V_o$.

The characteristics of the NMOS transistor M7 to M10 are supposed to be substantially identical to each other, and the characteristics of the PMOS transistor M11 are supposed to be substantially identical to those of the PMOS transistor M12. In this case, the output voltage $V_o$ of the NMOS transistor differential amplifier having such a circuit arrangement is substantially equal to an averaged voltage between the first input voltage $V_1$ and the second input voltage $V_2$, namely an in-phase voltage $((V_1+V_2)/2)$. The NMOS transistor M9 and the NMOS transistor M7 flow a current $I_{2N}$ and a current $I_{3N}$ corresponding to the first input voltage $V_1$ and the second input voltage $V_2$, respectively. A current $I_R/2$ equal to a summation of the current $I_{2N}$ and the current $I_{3N}$ flows through the PMOS transistor M11. Since the PMOS transistor M11 and the PMOS transistor M12 constitute the current mirror circuit, the current $I_R/2$ equal to that of the current flowing through the PMOS transistor M11 flows through the NMOS transistor M8 and the NMOS transistor M10. Since the NMOS transistor M8 and the NMOS transistor M10 have the same characteristics, a currents $I_{1N}$ flows through the NMOS transistor M8 and the NMOS transistor M10. Since a summation between the current flowing through the NMOS transistor M8 and the current flowing through the NMOS transistor M10 is coincident with a summation between the current flowing through the NMOS transistor M9 and the current flowing through the NMOS transistor M7, the current $I_{1N}$ is coincident with an averaged current between the current $I_{2N}$ and the current $I_{3N}$. Further, since the characteristics of the NMOS transistor M8 and the NMOS transistor M10 are coincident with the characteristics of the NMOS transistor M9 and the NMOS transistor M7, the voltage at the gates of the NMOS transistor M8 and M10 is substantially equal to the averaged voltage of the first input voltage $V_1$ and the second voltage $V_2$, namely, the in-phase voltage $((V_1+V_2)/2)$.

In other words, assuming now that a voltage which is applied to one non-inversion input terminal is equal to $V_1$ and another voltage which is applied to the other non-inversion input terminal is equal to $V_2$, a voltage $V_0$ which is finally outputted from the NMOS transistor differential amplifier shown in FIG. 5 is expressed by the following equation (3):

$$V_o = \frac{V_1 + V_2}{2} + \frac{2\sqrt{\frac{2I_1}{\beta}} - \sqrt{\left(2\sqrt{\frac{2I_1}{\beta}}\right)^2 - (V_1 - V_2)^2}}{2} \quad (3)$$

where $\beta$ is expressed by the following equation (1), like the PMOS transistor differential amplifier:

$$\beta = \frac{W}{L} \mu C_o \quad (1)$$

where I1 is a current which flows through each of the NMOS transistor M8 and the NMOS transistor M10.

Figure 6:
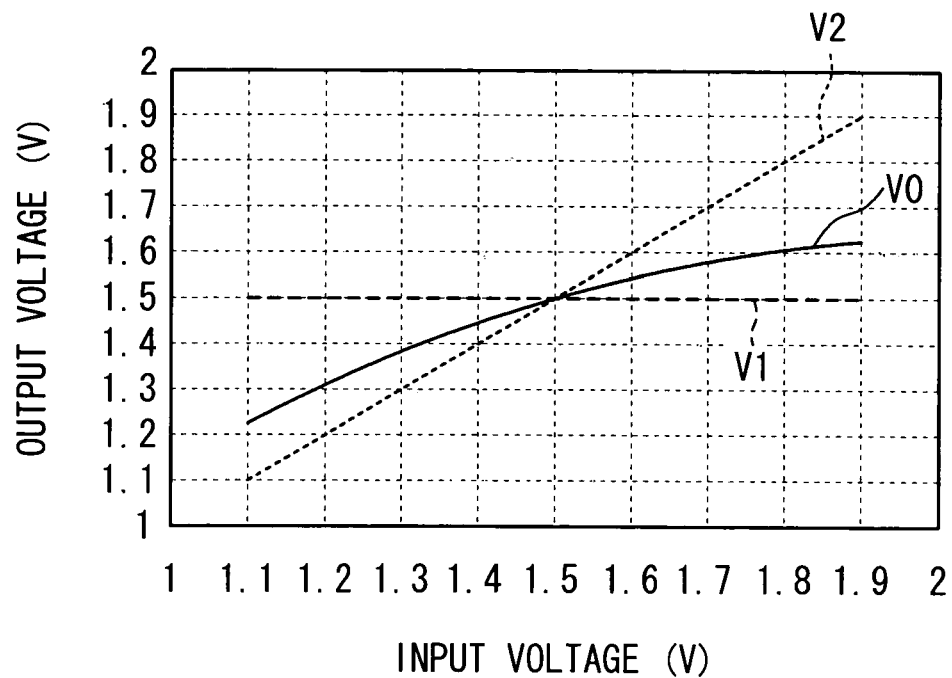
FIG. 6 is a diagram showing an input/output characteristic of the 2-input amplifier shown in FIG. 4.

FIG. 6 is a diagram graphically showing an actual input/output characteristic of the PMOS transistor differential amplifier. Referring to FIG. 6, the output voltage $V_o$ of the PMOS transistor differential amplifier with the two inputs is nearly equal to:

$$V_o=(V_1+V_2)/2.$$

When a difference between the two inputted voltages $V_1$ and $V_2$ is relatively small. However, when a difference between the two inputted voltages $V_{1\ and\ V2}$ becomes large, an error of the output voltage $V_o$ from $(V_1+V_2)/2$ becomes large.

Figure 7:
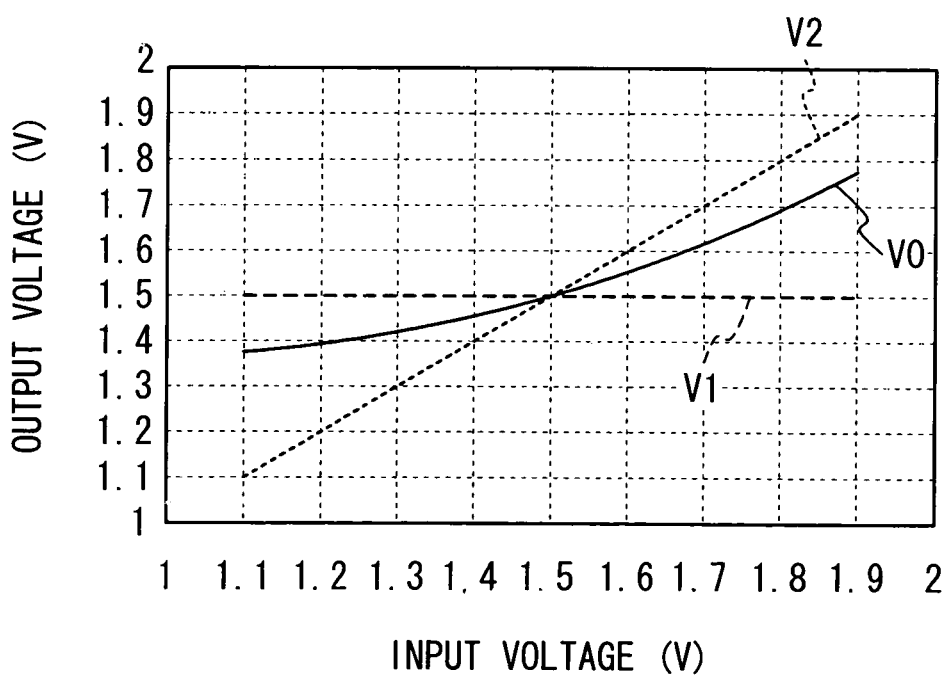
FIG. 7 is a diagram showing an input/output characteristic of the 2-input amplifier shown in FIG. 5.

FIG. 7 is a diagram graphically showing an actual input/output characteristic of the NMOS transistor differential amplifier. Referring to FIG. 7, the output voltage $V_o$ of the NMOS transistor differential amplifier with the two inputs is nearly equal to:

$$V_o=(V_1+V_2)/2.$$

When a difference between the tow inputted voltages $V_1$ and $V_2$ is relatively small. However, when a difference between the two inputted voltages $V_1$ and $V_2$ becomes large, an error of the output voltage $V_o$ from $(V_1+V_2)/2$ becomes large.

Furthermore, when the input/output characteristic of FIG. 6 is compared with that of FIG. 7, it could be seen that polarities of errors are opposite to each other, when the difference between input voltages $V_1$ and $V_2$ becomes large in the PMOS transistor differential amplifier and the NMOS transistor differential amplifier.

Referring now to FIG. 3, an input stage constitutes a differential amplifier having two non-inversion inputs. The differential amplifying circuit shown in FIG. 3 is composed of a PMOS transistor differential stage having a circuit arrangement similar to that of the above-described PMOS transistor differential amplifier, and an N differential stage having a circuit arrangement similar to that of the above-explained NMOS transistor differential amplifier, between which the amplifying unit A1 is shared.

The PMOS transistor differential stage is formed from the constant current source CC1, the four PMOS transistors M1 to M4 and the two NMOS transistors M5 and M6. The sources of the four PMOS transistors M1 to M4 are commonly connected to each other, and the constant current source CC1 is inserted between the power supply voltage $V_{pp}$ and the drains of the four PMOS transistors. The drains of the PMOS transistors M1 and M3 are commonly connected to each other, and the drains of the PMOS transistors M2 and M4 are commonly connected to each other. The NMOS transistors M5 and M6 constitute the current mirror circuit and functions as the active load.

The NMOS transistor differential stage is formed from the constant current source CC2, the four NMOS transistors M7 to M10 and the first and second current mirror circuits CM1 and CM2. Each of the first and second current mirror circuits CM1 and CM2 is formed from the PMOS transistors M11 and M12. The output of the PMOS transistor M11 in the first current mirror circuit is connected with the NMOS transistors M7 and M9, and the output of the PMOS transistor M12 is connected with drain of the NMOS transistor M6. Also, the output of the PMOS transistor M11 in the second current mirror circuit is connected with the NMOS transistors M8 and M10, and the output of the PMOS transistor M12 is connected with drain of the NMOS transistor M5. The sources of the four NMOS transistors M7 to M10 are commonly connected to each other, and the constant current source CC2 is inserted between the ground voltage and the drains of the four NMOS transistors. The sources of the NMOS transistors M7 and M9 are commonly connected to each other, and the sources of the NMOS transistors M8 and M10 are commonly connected to each other. In the N differential stage, the current mirror circuit CM1 and the current mirror circuit CM2 are provided in place of the current mirror circuit M11 and M12. The current mirror circuit CM1 supplies the current $I_R/2$ from one output to the NMOS transistors M7 and M9, and the other output is connected to the drain of the NMOS transistor M6. Also, the current mirror circuit CM2 supplies the current $I_R/2$ from one output to the NMOS transistors M8 and M10, and the other output is connected to the drain of the NMOS transistor M5.

Furthermore, the output of the amplifying unit A1 is connected with the gate of the NMOS transistor M8 and the gate of the NMOS transistor M10 commonly and with the gate of the PMOS transistor M2 and the gate of the PMOS transistor M4 commonly, so as to constitute a voltage follower connection. The gate of the NMOS transistor M9 and the gate of the PMOS transistor M3 as a first input terminal are commonly connected with the first input voltage $V_1$, and the gate of the NMOS transistor M7 and the gate of the PMOS transistor M1 as a second input terminal are commonly connected with the second input voltage $V_2$.

The gate of the NMOS transistor M5 is connected to the gate of the NMOS transistor M6, and the gate of the NMOS transistor M5 is connected to the drain of the NMOS transistor M5. The sources of the NMOS transistors M5 and M6 are connected to the ground terminal GND. The drain of the NMOS transistor M5 is connected to the drains of the PMOS transistors M1 and M3 and the current mirror circuit CM2. The drain of the NMOS transistor M6 is connected to the drains of the NMOS transistor M2 and M4, the input of the amplifying unit A1 and the current mirror circuit CM1.

Assuming now that the voltage at the common source of the PMOS transistor differential stage is $V_{MP}$, and the voltage at the common source of the NMOS transistor differential stage is $V_{MN}$, a calculation is carried out. With reference to FIG. 3, assuming now that the current flowing through each of the PMOS transistor M2 and the PMOS transistor M4 is $I_{1P}$, the current flowing through the PMOS transistor M3 is $I_{2P}$, and the current flowing through the PMOS transistor M1 is $I_{3P}$, the current $4I_{1P}$ flows through the PMOS transistor differential stage and is expressed by the following equation (4):

$$4I_{1P}=2I_{1P}+I_{2P}+I_{3P} \tag{4}$$

Also, assuming now that the current flowing through each of the NMOS transistor M8 and the NMOS transistor M10 is $I_{1N}$, the current flowing through the NMOS transistor M9 is $I_{2N}$, and the current flowing through the NMOS transistor M7 is $I_{3N}$, the current $4I_{1N}$ flows through the NMOS transistor differential stage and is expressed by the following equation (5):

$$4I_{1N}=2I_{1N}+I_{2N}+I_{3N} \tag{5}$$

In this case, since the currents flowing through the active load are equal to each other, the following equation (6) is given:

$$I_{2P}+I_{3P}+2I_{1N}=I_{2N}+I_{3N}+2I_{1P} \tag{6}$$

At this time, assuming that a mobility in a PMOS transistor is $\mu_P$, a mobility in an NMOS transistor is $\mu_N$, and a ratio of a gate width W of the PMOS transistor to a gate length L thereof is:

$$\left.\frac{W}{L}\right|_P$$

and a ratio of the gate width W of the NMOS transistor to the gate length L thereof is $$\left.\frac{W}{L}\right|_N$$

the following calculation is carried out by employing $\beta_P$ and $\beta_N$ which are expressed by the following equations (7) and (8) when a gate oxide film capacitance per a unit area of each of the PMOS and NMOS transistors is equal to CO;

$$\beta_P = \left.\frac{W}{L}\right|_P \mu_P C_o, \qquad (7)$$

$$\beta_N = \left.\frac{W}{L}\right|_N \mu_N C_o. \qquad (8)$$

Based upon a relation between a gate-to-drain voltage and a drain current, it is assumed that a common source-to-node voltage in the PMOS transistor differential stage is $V_{MP}$, and a common source-to-node voltage in the NMOS transistor differential stage is $V_{MN}$. Also, assuming now that a threshold voltage of the PMOS transistor is $V_{TP}$ and a threshold voltage of the NMOS transistor is $V_{TN}$, currents which flow through the respective transistors are expressed as follows:

$$I_{1P} = \frac{\beta_P}{2}(V_{MP} - V_o - V_{TP})^2, \qquad (9)$$

$$I_{2P} = \frac{\beta_P}{2}(V_{MP} - V_1 - V_{TP})^2, \qquad (10)$$

$$I_{3P} = \frac{\beta_P}{2}(V_{MP} - V_2 - V_{TP})^2, \qquad (11)$$

$$I_{1N} = \frac{\beta_N}{2}(V_o - V_{MN} - V_{TN})^2, \qquad (12)$$

$$I_{2N} = \frac{\beta_N}{2}(V_1 - V_{MN} - V_{TN})^2, \qquad (13)$$

$$I_{3N} = \frac{\beta_N}{2}(V_2 - V_{MN} - V_{TN})^2. \qquad (14)$$

If the above-described equations (9) to (14) are substituted for the above-explained equation (6), the following equation (15) is given:

$$\frac{\beta_P}{2}\{(V_{MP} - V_1 - V_{TP})^2 + (V_{MP} - V_2 - V_{TP})^2\} + \qquad (15)$$

$$\beta_N(V_o - V_{MN} - V_{TN})^2$$

-continued $$= \frac{\beta_N}{2}\{(V_1 - V_{MN} - V_{TN})^2 + (V_2 - V_{MN} - V_{TN})^2\} +$$

$$\beta_P(V_{MP} - V_o - V_{TP})^2.$$

In this case, based upon a relation between the gate-to-source voltage $V_{GS}$ and the drain currents ($I_{1P}$, $I_{1N}$), the following equation can be satisfied in the PMOS channel differential stage:

$$V_{MP} - V_{TP} = \sqrt{\frac{2I_{1P}}{\beta_P}} + V_o$$

In other words, the following equal (16) can be satisfied:

$$V_{GS} = V_{MP} - V_o = \sqrt{\frac{2I_{1P}}{\beta_P}} + V_{TP}. \qquad (16)$$

Similarly, the following equation can be satisfied in the NMOS channel differential stage:

$$V_{GS} = V_o - V_{MN} = \sqrt{\frac{2I_{1N}}{\beta_N}} + V_{TN}.$$

In other words, the following equation (17) can be satisfied:

$$-V_{MN} - V_{TN} = \sqrt{\frac{2I_{1N}}{\beta_N}} - V_o. \qquad (17)$$

If these equations (16) and (17) are substituted for the above-mentioned equation (15), the following equation (18) is obtained:

$$\beta_P\left(\sqrt{\frac{2I_{1P}}{\beta_P}} + V_o - V_1\right)^2 + \beta_P\left(\sqrt{\frac{2I_{1P}}{\beta_P}} + V_o - V_2\right)^2 + \qquad (18)$$

$$2\beta_N \frac{2I_{1N}}{\beta_N}$$

$$= \beta_N\left(V_1 + \sqrt{\frac{2I_{1N}}{\beta_{N_o}}} - V_o\right)^2 + \beta_N\left(V_2 + \sqrt{\frac{2I_{1P}}{\beta_P}} - V_o\right)^2 +$$

$$2\beta_P \frac{2I_{1P}}{\beta_P}.$$

When this equation (18) is expanded, the following equation (19) is obtained:

$$2\sqrt{2\beta_P I_{1P}}(2V_o - V_1 - V_2) + \beta_P\{(V_o - V_1)^2 + (V_o - V_2)^2\}$$

$$= 2\sqrt{2\beta_N I_{1N}}(V_1 + V_2 - 2V_o) + \beta_N\{(V_1 - V_o)^2 + (V_2 - V_o)^2\} \qquad (19).$$

In this equation (19), if $\beta_P=\beta_N$, namely, $$\frac{W}{L}\bigg|_P \mu_P C_o = \frac{W}{L}\bigg|_N \mu_N C_o$$

$$\frac{W}{L}\bigg|_P \mu_P = \frac{W}{L}\bigg|_N \mu_N$$

then the following equation can be satisfied under the condition that $\beta_P=\beta_N=\beta$:

$$2\sqrt{2\beta}(2V_o-V_1-V_2)(\sqrt{I_{1P}}+\sqrt{I_{1N}})$$

$$+\beta\{(V_o-V_1)^2+(V_o-V_2)^2\}-\beta\{(V_1-V_o)^2+(V_2-V_o)^2\}=0.$$

When this equation is solved, the following equation is given as follows:

$$2V_o-V_1-V_2=0$$

In other words, $V_0$ is expressed by the following equation (20):

$$V_o = \frac{V_1 + V_2}{2}. \tag{20}$$

As a consequence, in accordance with the differential amplifier described in this first embodiment, the desirable half voltage of the two input voltages can be outputted irrespective of the current flowing through the PMOS transistor differential stage and the current through the NMOS transistor differential stage.

Figure 8:
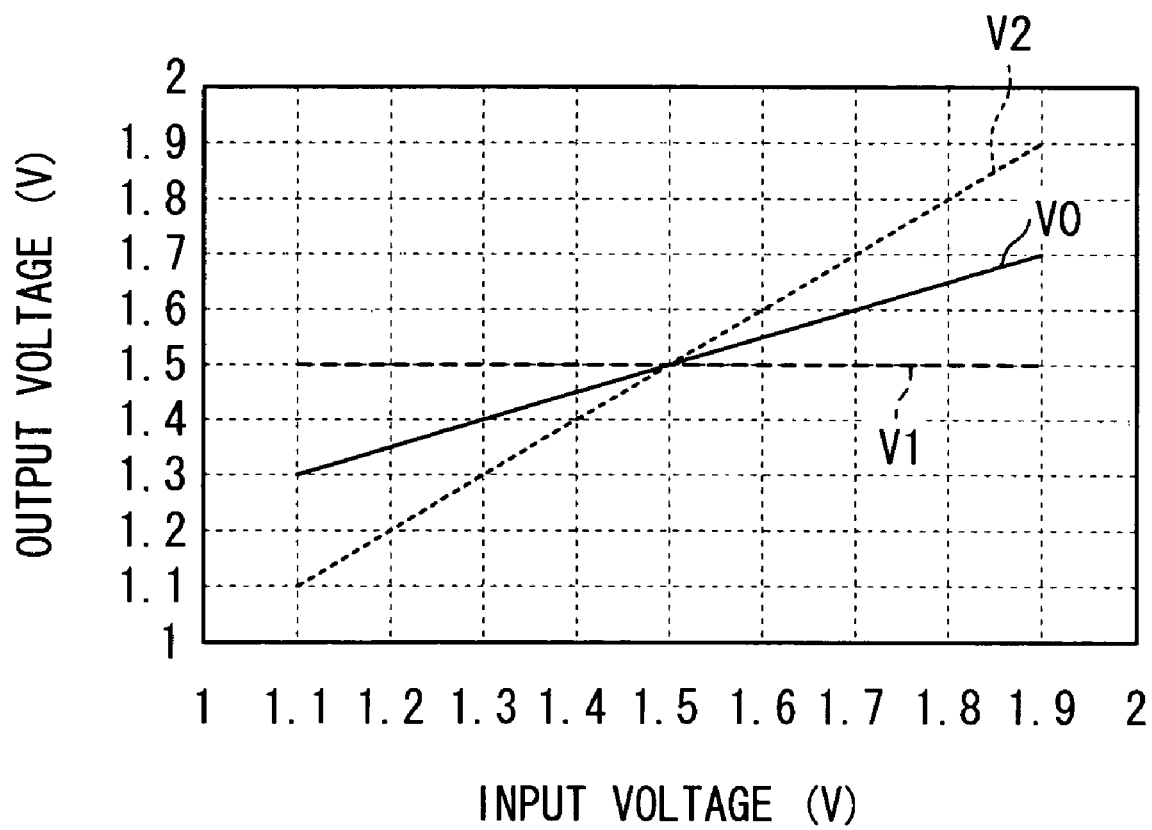
FIG. 8 is a diagram showing an input/output characteristic of the 2-input amplifier shown in FIG. 3.

FIG. 8 is a diagram graphically showing the input/output characteristic of the differential amplifier shown in FIG. 3. With reference to FIG. 8, it could be readily understood that even when a difference between the first input voltage $V_1$ and the second input voltage $V_2$ becomes large, the voltage of $(V_1+V_2)/2$ is outputted as the output voltage $V_0$ of the differential amplifier with the two inputs of this first embodiment.

Also, if $\beta_P$ is not equal to $\beta_N$, the following equation can be satisfied:

$$2(\sqrt{2\beta_P I_{1P}}-\sqrt{2\beta_N I_{1N}})(2V_o-V_1-V_2)+\beta_P\{2V_o^2-2V_o(V_1+V_2)$$

$$+V_1^2+V_2^2\}-\beta_N\{2V_o^2-2V_o(V_1+V_2)+V_1^2+V_2^2\}=0$$

When a left side of this equation is expanded, an equation (21) is obtained:

$$2(\beta_P-\beta_N)V_o^2-2V_o\{(\beta_P-\beta_N)(V_1+V_2)-2(\sqrt{2\beta_P I_{1P}}-\sqrt{2\beta_N I_{1N}})\}+(\beta_P-\beta_N)(V_1^2+V_2^2)-2(\sqrt{2\beta_P I_{1P}}-\sqrt{2\beta_N I_{1N}})(V_1+V_2)=0 \tag{21}$$

When this equation (21) is solved with respect to $V_o$, the following equation (22) is obtained as follows:

$$V_o = \frac{V_1+V_2}{2} - \frac{(\sqrt{2\beta_P I_{1P}}-\sqrt{2\beta_N I_{1N}})}{(\beta_P-\beta_N)} \pm \frac{\sqrt{16(\sqrt{2\beta_P I_{1P}}-\sqrt{2\beta_N I_{1N}})^2-4(\beta_P-\beta_N)^2(V_1-V_2)^2}}{4(\beta_P-\beta_N)}. \tag{22}$$

In this equation, based upon the condition of $V_1=V_2=V_0$ under $V_1=V_2$, symbol "plus or minus" becomes plus (+) in the above-explained equation (22). As a consequence, this equation (22) is transformed into the following equation (23):

$$V_o = \frac{V_1+V_2}{2} - \frac{(\sqrt{2\beta_P I_{1P}}-\sqrt{2\beta_N I_{1N}})}{(\beta_P-\beta_N)} + \frac{\sqrt{16(\sqrt{2\beta_P I_{1P}}-\sqrt{2\beta_N I_{1N}})^2-4(\beta_P-\beta_N)^2(V_1-V_2)^2}}{4(\beta_P-\beta_N)}. \tag{23}$$

This equation (23) expresses an equation when the NMOS transistor differential stage and the PMOS transistor differential stage are not balanced, and the second term and the third term constitute an error from a desirable value.

As indicated in the above-described equation (23), by using the differential amplifying circuit of this first embodiment, the precision of the averaged voltage of the 2-input amplifier can be considerably improved even when $\beta_P$ is not equal to $\beta_N$.

Second Embodiment

Figure 9:
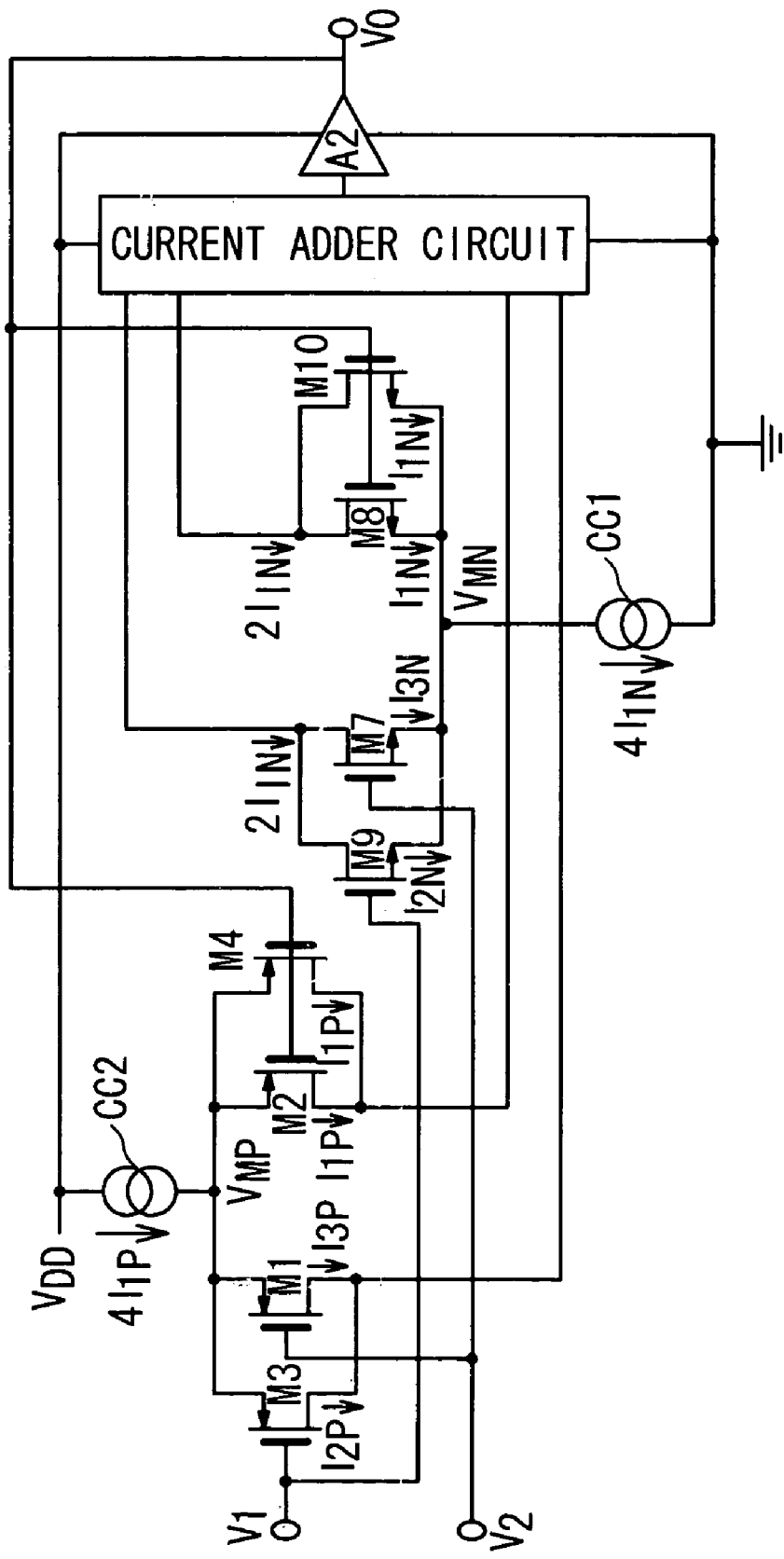
FIG. 9 is a circuit diagram showing a two-input amplifier according to a second embodiment of the present invention.

FIG. 9 is a diagram showing the circuit arrangement of a differential amplifier according to the second embodiment of the present invention. Referring now to FIG. 9, the differential amplifier of the second embodiment is formed from the 2-input PMOS transistor differential stage, the 2-input NMOS transistor differential stage, a current adder circuit and an amplifying unit A2. The 2-input PMOS transistor differential stage is composed of the constant current source CC2 and the PMOS transistors M1 to M4, like the PMOS transistor differential stage in the first embodiment. Also, the 2-input NMOS transistor differential stage is composed of the constant current source CC1 and the NMOS transistors M7 to M10, like the NMOS transistor differential stage in the first embodiment. The current adder circuit adds the outputs of the NMOS transistor differential stage and the outputs of the PMOS transistor differential stage, and outputs the addition result to the amplifying unit A2. The output of the amplifying unit A2 is commonly connected to the PMOS transistors M2 and M4 and the NMOS transistors M8 and M10 so as to construct a voltage follower.

Figure 10:
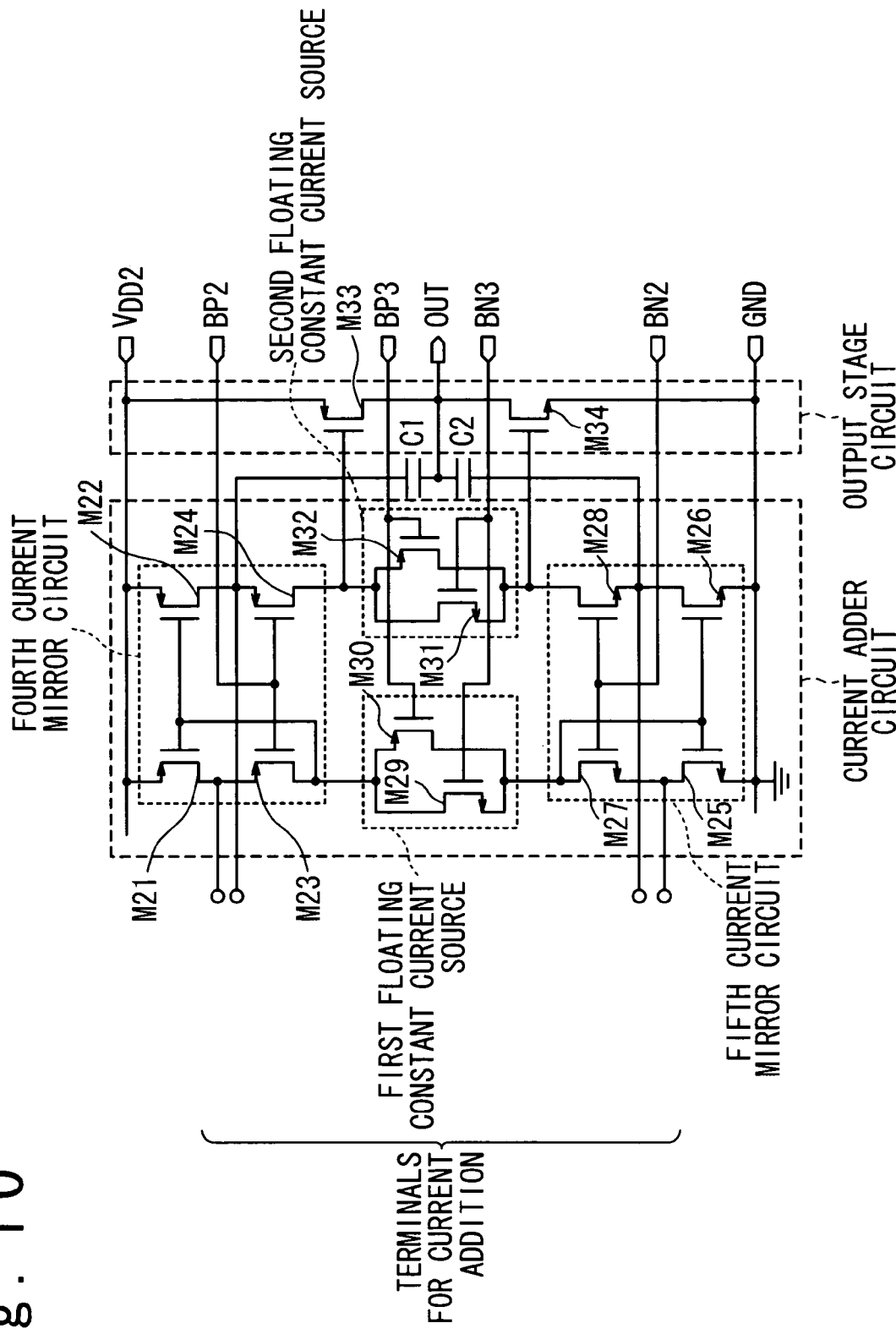
FIG. 10 is a circuit diagram showing a specific circuit of a current adder circuit employed in the 2-input amplifier of FIG. 9.

FIG. 10 is a specific circuit diagram of the current adder circuit. Referring now to FIG. 10, the current adder circuit contains a fourth current mirror circuit connected to a positive power supply voltage $V_{DD2}$, a fifth current mirror circuit connected to the ground terminal GND, first and second floating constant current sources between the fourth and fifth current mirror circuit. In this case, the power supply voltage is $V_{DD2}$ but may be $V_{DD}$.

The fourth current mirror circuit is a current mirror circuit of a low-voltage cascode connection. The fourth current mirror circuit contains PMOS transistors M21 to M24. The sources of the PMOS transistors M21 and M22 are connected to the positive power supply $V_{DD2}$. The gate of the PMOS transistor M21 is connected to the gate of the PMOS transistor M22, and the gate of the PMOS transistor M23 is connected to the gate of the PMOS transistor M24. The drain of the PMOS transistor M21 is connected with the source of the PMOS transistor M23, and the drain of the PMOS transistor M22 is connected with the source of the PMOS transistor M24. The drain of the PMOS transistor M23 is connected with the gate of the PMOS transistor M21. The gates of the PMOS transistors M23 and M24 are connected to a bias terminal BP2. The source of the PMOS transistor M23 and the source of the PMOS transistor M24 are connected to a common node of the drains of the NMOS transistors M7 and M9 and to a common node of the drains of the NMOS transistors M8 and M10, respectively. The bias signal BP2 and the following bias signal BN2 are respectively set to a low level and a high level during the amplification.

The fifth current mirror circuit is a current mirror circuit of a low-voltage cascode connection. The fifth current mirror circuit contains NMOS transistors M25 to M28. The sources of the NMOS transistors M25 and M26 are connected to the ground voltage GND. The gate of the NMOS transistor M25 is connected to the gate of the NMOS transistor M26, and the gate of the PMOS transistor M27 is connected to the gate of the NMOS transistor M28. The drain of the NMOS transistor M25 is connected with the source of the NMOS transistor M27, and the drain of the NMOS transistor M26 is connected with the source of the NMOS transistor M28. The drain of the NMOS transistor M27 is connected with the gate of the NMOS transistor M25. The gates of the NMOS transistors M27 and M28 are connected to a bias terminal BN2. The source of the NMOS transistor M27 and the source of the NMOS transistor M28 are connected to a common node of the drains of the PMOS transistors M2 and M4 and to a common node of the drains of the PMOS transistors M1 and M3, respectively.

The first floating constant current source contains a PMOS transistor M30 and an NMOS transistor M29 which are connected in parallel. The source of the PMOS transistor M30 and the drain of the NMOS transistor M29 are connected to the drain of the PMOS transistor M23. Also, the drain of the PMOS transistor M30 and the source of the NMOS transistor M29 are connected to the drain of the NMOS transistor M27. The gate of the PMOS transistor M30 and the gate of the NMOS transistor M29 are connected to bias terminals BP3 and BN3, respectively. As a result, a constant current flows from the fourth current mirror circuit to the fifth current mirror circuit based on signals on the bias terminals BP3 and BN3.

The second floating constant current source contains a PMOS transistor M32 and an NMOS transistor M31 which are connected in parallel. The source of the PMOS transistor M32 and the drain of the NMOS transistor M31 are connected to the drain of the PMOS transistor M24. Also, the drain of the PMOS transistor M32 and the source of the NMOS transistor M31 are connected to the drain of the NMOS transistor M28. The gate of the PMOS transistor M32 and the gate of the NMOS transistor M31 are connected to the bias terminals BP3 and BN3, respectively. As a result, a constant current flows from the fourth current mirror circuit to the fifth current mirror circuit based on signals on the bias terminals BP3 and BN3.

In this current adder circuit, a node between the drain of the PMOS transistor M21 and the source of the PMOS transistor M23 commonly connected to each other, and a node between the drain of the PMOS transistor M22 and the source of the PMOS transistor M24 function as a positive current adding terminal. Also, a node between the drain of the NMOS transistor M25 and the source of the NMOS transistor M27 commonly connected to each other, and a node between the drain of the NMOS transistor M26 and the source of the NMOS transistor M28 function as a negative current adding terminal. A series circuit of capacitors C1 and C2 is connected between the drain of the PMOS transistor M22 and the drain of the NMOS transistor M28. A node between the capacitors C1 and C2 is connected with an output terminal OUT.

An output stage circuit as the amplifying unit A2 contains a PMOS transistor M33 and an NMOS transistor M34 which are connected in series. The source of the PMOS M33 is connected to the positive power source terminal $V_{DD2}$, and the source of the NMOS transistor M34 is connected to the negative power source terminal GND. The gate of the NMOS transistor M33 is connected to the drain of the PMOS transistor M24 as the output of the fourth current mirror circuit, and the gate of the NMOS transistor M34 is connected to the drain of the NMOS transistor M28 as the output of the fifth current mirror circuit. A node between the PMOS transistor M33 and the NMOS transistor M34 is connected with the output terminal OUT. The output stage circuit constitutes a so-called an AB class output circuit, and an idling current is determined based upon a voltage between the above-described bias terminals BP3 and BN3.

In this current adder circuit, signals of transistors which are connected to respective current adding terminals are added to each other, and an adding result is outputted to an output terminal OUT. Since the differential amplifier shown in FIG. 9 is provided with the current adder circuit shown in FIG. 10, input currents are not added to each other in the active load, but are separately processed.

In the second embodiment, the following calculation is carried out, assuming now that a voltage at the common sources of the PMOS transistor differential stage is $V_{MP}$, and a voltage at the common sources of the NMOS transistor differential stage is $V_{MN}$.

$$4I_{1P}=2I_{1P}+I2P+I_{3P} \qquad (4)$$

$$4I_{1N}=2I_{2N}+I_{3N} \qquad (5)$$

Since the current flowing through the active loads are equal to each other, the following equations (24) and (25) can be obtained:

$$I_{2P}+I_{3P}=2I_{1N} \qquad (24)$$

$$I_{2N}+I_{3N}=2I_{1P} \qquad (25)$$

Even if the left side of the equation (25) is added to the right side of the equation (24), and the right side of the equation (25) is added to the left side of the equation (24), the following equation (26) can be satisfied:

$$I_{2P}+I_{3P}+2I_{1N}=I_{2N}+I_{3N}+2I_{1P} \qquad (26)$$

It could be understood that this equation (26) is completely the same as the equation (6) of the differential amplifier (namely, differential amplifier which adds the N-channel output to the P-channel output in the active load) in the first embodiment. Therefore, the calculation results become equal to each other. In other words, the differential amplifier shown in FIG. 9 outputs a desirable half voltage of the two input voltages.

Moreover, since the circuit arrangement of the present invention is employed, an input Rail-to-rail can be realized. In FIG. 9, in order to realize the input Rail-to-rail as the entire characteristic of the differential amplifier, the circuit arrangement of the current adder circuit is important. This reason will now be described with reference to FIG. 9. First of all, in order to realize the input Rail-to-rail, all of the input stage transistors M1 to M4, or all of other transistors M7 to M10 are required to enter into a pentode region (namely, saturation region). This is because of the following reason. That is, if these transistors M1 to M4, or M7 to M10 enters into a triode region, the output resistance of the transistor is extremely lowered, and the mutual conductance gm of the transistor is also lowered, so that these transistors cannot carry out the normal differential stage transistor operation. A condition when an MOS transistor enters into the pentode region (saturation region) is expressed by the following equation (27), assuming now that a drain-to-source voltage is $V_{DS}$, a gate-to-source voltage is $V_{GS}$, and a threshold voltage is $V_T$:

$$V_{DS} > V_{GS} - VT \tag{27}$$

In this case, the condition under which the PMOS transistors M1 to M4 enters into the pentode region (saturation region) when the input voltage becomes the minimum voltage of GND (zero volt) is the gate voltage of GND (zero volt), since the source voltages of these PMOS transistor become equal to $V_{GS}$. On the other hand, assuming now that a drain voltage is equal to $V_D$, the source-to-drain voltage $V_{DS}$ is given by the following equation (28):

$$V_{DS} = V_{GS} - V_D \tag{28}$$

Based upon the conditions defined by the above-described equation (27) and equation (28), the current adder circuit needs to be designed in such a manner that the following equation can be satisfied:

$$V_{GS} - V_D > V_{GS} - V_T,$$

namely, $$V_D < V_T \tag{29}$$

The voltage $V_D$ is a voltage of a node to which the drains of the MOS transistors M1 and M3, or the drains of the MOS transistors M2 and M4 are connected. Based upon this condition and the above-described equation (29), the input voltage of the current adder circuit must be set lower than or equal to VT. Now, as a specific value, since a threshold voltage VT of a general transistor is approximately 0.7 V, the input voltage of the current adder circuit needs to be lower than or equal to approximately 0.7 V in accordance with the equation (29).

Similarly, the condition under which the NMOS transistors M7 to M10 enters into the pentode region (saturation region) when the input voltage is equal to the maximum potential of $V_{DD}$ is the gate voltages of $V_{DD}$. Therefore, the source voltages of these NMOS transistors become equal to $V_{DD} - V_{GS}$ at this time. On the other hand, assuming now that the drain voltage is equal to $V_D$, the source-to-drain voltage $V_{DS}$ is given by the following equation (30):

$$V_{DS} = V_D - (V_{DD} - V_{GS}) \tag{30}$$

Based upon the conditions defined by the above-described equation (27) and equation (30), the current adder circuit is required to be designed in such a manner that the following equation can be satisfied:

$$V_D - V_{DD} + V_{GS} > V_{GS} - V_T$$

namely, $$V_{DD} - V_D < V_T \tag{31}$$

The drain voltage $V_D$ is a terminal voltage of a node to which the drains of the NMOS transistors M7 and M9, or the drains of the NMOS transistors M8 and M10 are connected. Based upon this condition and the above-described equation (31), the input voltage of the current adder circuit must be set higher than or equal to $V_{DD} - V_T$. Now, as specific value, the input voltage is required to be set higher than or equal to approximately ($V_{DD} - 0.7V$). The current adder circuit of FIG. 9 is required to be designed in such a manner that the above-explained conditions can be satisfied. It should be noted that one example of the current adder circuits capable of satisfying the conditions is the circuit arrangement of the current adder circuit shown in FIG. 10.

Next, the reason why this current adder circuit of FIG. 10 can satisfy the above-described conditions will now be explained. The input terminal voltage of the current adder circuit when the input voltage is equal to GND (zero volt) is drain voltages $V_{D(M25/M26)}$ of the NMOS transistors M25 and M26. Assuming now that the terminal voltage of the bias terminal BN2 is $V_{BN2}$ and the gate-to-source voltage of each of the NMOS transistors M27 and M28 is $V_{GS(M27/M28)}$, this drain voltage $V_{D(M25/M26)}$ is given by the following equation (32):

$$V_{D(M25/M26)} = V_{BN2} - V_{GS(M27/M28)} \tag{32}$$

In this case, this terminal voltage $V_{BN2}$ of the bias terminal BN2 is generated by the gate-to-source voltage of the MOS transistor in a general design. Therefore, the above-equation (32) is modified as follows:

$$V_{D(M25/M26)} = V_{GS} - V_{GS(M27/M28)} < 0.7\ V \tag{33}$$

As a consequence, this equation (33) can satisfy the above conditions. Similarly, when the input voltage is the maximum potential of $V_{DD}$, the above-described conditions can be satisfied. Thus, if such a circuit arrangement is employed, the input Rail-to-rail can be realized. As a result, the use efficiency of the power supply can be increased, and the low voltage and the low power consumption can be realized.

Figure 11:
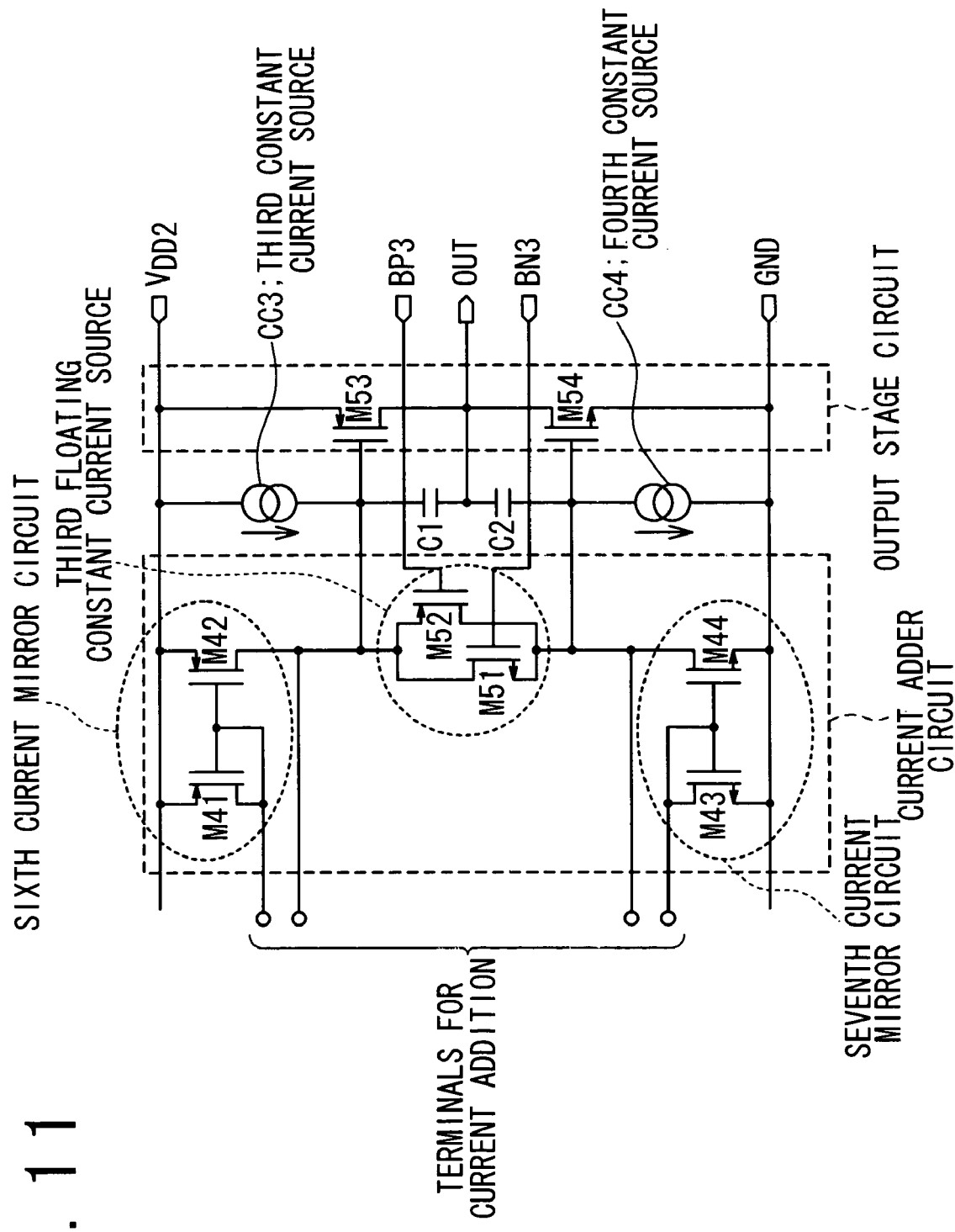
FIG. 11 is a circuit diagram showing another specific circuit of the current adder circuit employed in the 2-input amplifier of FIG. 9.

FIG. 11 is a diagram showing another specific circuit of the current adder circuit. Referring now to FIG. 11, this current adder circuit will be described. The current adder circuit shown in FIG. 11 is composed of a sixth current mirror circuit connected to the positive power supply, a seventh current mirror circuit connected to the ground terminal GND, and a third floating constant current source. This sixth current mirror circuit is composed of PMOS transistors M41 and M42. The gate of the PMOS transistor M41 is connected to the gate of the PMOS transistor M42, and the drain of the PMOS transistor M41. Also, the sources of the PMOS transistors M41 and M42 are connected to the positive power supply voltage $V_{DD2}$. The drains of the PMOS transistor M41 and M42 are connected to a node of the drains of the NMOS transistors M7 and M9 and a node of the drains of the NMOS transistors M8 and M10, respectively.

This seventh current mirror circuit is composed of NMOS transistors M43 and M44. The gate of the NMOS transistor M43 is connected to the gate of the NMOS transistor M44, and the drain of the NMOS transistor M43. Also, the sources of the NMOS transistors M43 and M44 are connected to the ground voltage GND. The drains of the NMOS transistor M43 and M44 are connected to a node of the drains of the PMOS transistors M2 and M4 and a node of the drains of the PMOS transistors M1 and M3, respectively.

The third floating constant current source is composed of a PMOS transistor M52 and an NMOS transistor M51 which are connected in parallel. The source of the PMOS transistor M52 and the drain of the NMOS transistor M51 are commonly connected to the drain of the NMOS transistor M44. Also, the source of the PMOS transistor M52 and the drain of the NMOS transistor M51 are commonly connected to the drain of the PMOS transistor M42. The gate of the PMOS transistor M52 and the gate of the NMOS transistor M51 are connected with bias terminals BP3 and BN3, respectively.

A series circuit of a constant current source CC3, capacitors C1 and C2, and a constant current source CC4 is provided between the positive power supply voltage $V_{DD2}$ and the ground voltage GND. A node between the constant current source CC3 and the capacitor C1 is connected with the drain of the PMOS transistor M42. Also, a node between the constant current source CC4 and the capacitor C2 is connected with the drain of the NMOS transistor M44. A node between the capacitors C1 and C2 is connected with an output terminal OUT.

An output stage circuit is composed of a PMOS transistor M53 and an NMOS transistor M54 which are connected in series between the power supply voltage $V_{DD2}$ and the ground voltage GND. The gate of the PMOS transistor M53 is connected to the drain of the PMOS transistor M42 and the node between the constant current source CC3 and the capacitor C1. Also, the gate of the NMOS transistor M54 is connected to the drain of the NMOS transistor M44 and the node between the constant current source CC4 and the capacitor C2. A node between the PMOS transistor M53 and the NMOS transistor M54 is connected with the output terminal OUT. This output stage circuit constitutes a so-called AB class output circuit, and an idling current is determined based upon a voltage between the bias terminals BP3 and BN3. The constant current source CC3 flows a same current as the constant current source CC4 flows, and may be same as a current flowing through the third floating constant current source.

In this current adder circuit shown in FIG. 11, current consumption becomes small, as compared with that of the current adder circuit of FIG. 10. The reason is in that the first floating constant current source of MOS transistors M29 and M30 can be omitted in the current adder circuit in FIG. 11 as well as the current flowing through the current path of the transistors M51/M52 can be reduced to a minimum current value in a design.

As described above, in accordance with the present invention, the NMOS transistor differential amplifier and the PMOS transistor differential amplifier are combined with each other so as to cancel the errors in the respective differential amplifiers. As a result, when the two different input voltages $V_1$ and $V_2$ are supplied to the two input terminals, the averaged voltage, namely, $(V_1+V_2)/2$ can be correctly outputted.

What is claimed is:

1. A differential amplifier circuit comprising:
    a first differential transistor pair which receives a first input signal at a first transistor, a second input signal at a second transistor and an output signal as a third input signal at third and fourth transistors;
    a second differential transistor pair which receives said first input signal at a fifth transistor, said second input signal at a sixth transistor and said output signal as a fourth input signal at seventh and eighth transistors.

2. The differential amplifier circuit according to claim 1, further comprising:
    an adder section which adds first output signals from said first differential transistor pair and second output signals from said second differential transistor pair; and
    an amplifying unit which amplifies an addition resultant signal from said adder section to produce said output signal and outputs said output signal to said first and second differential transistor pairs.

3. The differential amplifier according to claim 2, wherein said first differential transistor pair comprises:
    first and second P-channel transistors having sources which are commonly connected, gates which respectively receive said first and second input signals, and drains which are commonly connected; and
    third and fourth P-channel transistors having sources which are commonly connected with said sources of said first and second P-channel transistors, gates which commonly receive said output signal, and drains which are commonly connected; and
    wherein said second differential transistor pair comprises:
    fifth and sixth N-channel transistors having sources which are commonly connected, gates which respectively receive said first and second input signals, and drains which are commonly connected; and
    seventh and eighth N-channel transistors having sources which are commonly connected with said sources of said fifth and sixth N-channel transistors, gates which commonly receive said output signal, and drains which are commonly connected,
    wherein said first output signals are respectively output from said drains of said first and second P-channel transistors and said drains of said third and fourth P-channel transistors, and
    wherein said second output signals are respectively output from said drains of said fifth and sixth N-channel transistors and said drains of said seventh and eighth N-channel transistors.

4. The differential amplifier circuit according to claim 3, wherein said adder section comprises:
    a first current mirror circuit connected with said first differential transistor pair to receive said first output signals;
    a second current mirror circuit which is connected with said second differential transistor pair and outputs one of said second output signals to one of transistors of said first current mirror circuit; and
    a third current mirror circuit which is connected with said second differential transistor pair and outputs the other of said second output signals to the other of said transistors of said first current mirror circuit.

5. The differential amplifier according to claim 4, further comprising:
    first and second constant current sources,
    wherein said first and second P-channel transistors are connected in parallel to each other and said sources of said first and second P-channel transistors are connected with said first constant current source, and said drains of said first and second P-channel transistors are commonly connected with one of transistors of said first current mirror circuit to output one of said first output signals to said one transistor of said first current mirror circuit,
    said third and fourth P-channel transistors are connected in parallel to each other and said sources of said third and fourth transistors are connected with said first constant current source, and said drains of said third and fourth transistors are commonly connected with the other of transistors of said first current mirror circuit to output the other of said first output signals to said other transistor of said first current mirror circuit,
    said fifth and sixth N-channel transistors are connected in parallel to each other and said source of said fifth and sixth N-channel transistors are connected with said second constant current source, and said drains of said fifth and sixth N-channel transistors are commonly connected with one of transistors of said second current mirror circuit, and said seventh and eighth N-channel transistors are connected in parallel to each other and said sources of said seventh and eighth N-channel transistors are connected with said second constant current source, and said drains of said seventh and eighth N-channel transistors are commonly connected with one of transistors of said third current mirror circuit, wherein one of said second output signals is supplied from the other transistor of said second current mirror circuit to said other transistor of said first current mirror circuit, and the other of said second output signals is supplied from the other transistor of said third current mirror circuit to said one transistor of said first current mirror circuit.

6. The differential amplifier circuit according to claim 2, wherein said adder section comprises:

a fourth current mirror circuit which receives said second output signals;

a fifth current mirror circuit which receives said first output signals; and a floating constant current source section connected between said fourth and fifth current mirror circuits, wherein said amplifying unit is driven based on a third output signal from said fourth current mirror circuit and a fourth output signal from said fifth current mirror circuit to output said addition resultant signal.

7. The differential amplifier circuit according to claim 6, wherein each of said fourth and fifth current mirror circuits is of a cascode connection type.

8. The differential amplifier circuit according to claim 6, wherein said floating constant current source section comprises:

a first current source section which comprises a P-channel MOS transistor and an N-channel MOS transistor which are connected in parallel and is connected between one side of said fourth current mirror circuit and one side of said fifth current mirror circuit; and a second current source section which comprises a P-channel MOS transistor and an N-channel MOS transistor which are connected in parallel and is connected between the other side of said fourth current mirror circuit and the other side of said fifth current mirror circuit.

9. The differential amplifier circuit according to claim 6, wherein said amplifying unit comprises:

a P-channel MOS transistor and an N-channel MOS transistor which are connected in series, said P-channel MOS transistor and said N-channel MOS transistor of said output stage circuit receive as said addition resultant signal, said third output signal from said fourth current mirror circuit and said fourth output signal from said fifth current mirror circuit respectively, and said output signal is outputted from a node between said P-channel MOS transistor and said N-channel MOS transistor of said output stage circuit.

10. The differential amplifier circuit according to claim 6, wherein said floating constant current source section comprises:

a first current source section which comprises a P-channel MOS transistor and an N-channel MOS transistor which are connected in parallel and is connected between one side of said fourth current mirror circuit and one side of said fifth current mirror circuit.

11. The differential amplifier circuit according to claim 10, wherein said amplifying unit comprises:

a P-channel MOS transistor and an N-channel MOS transistor which are connected in series, said P-channel MOS transistor and said N-channel MOS transistor of said output stage circuit receive as said addition resultant signal, said third output signal from said fourth current mirror circuit and said fourth output signal from said fifth currentmirror circuit respectively, and said output signal is outputted from a node between said P-channel MOS transistor and said N-channel MOS transistor of said output stage circuit.

12. The differential amplifier circuit according to claim 5, wherein a mobility of each of said first to fourth P-channel MOS transistors is $\mu_P$, and a mobility of each of said fifth to eighth N-channel MOS transistors is $\mu_N$, a ratio of a gate width W of each of said first to fourth P-channel MOS transistors to a gate length L thereof is:

$$\left. \frac{W}{L} \right|_P$$

a ratio of a gate width W of each of said fifth to eighth N-channel MOS transistors to a gate length L thereof is:

$$\left. \frac{W}{L} \right|_N$$

when a gate oxide film capacitance per unit area of each of said first to fourth P-channel MOS transistors and said fifth to eighth N-channel MOS transistors is $C_0$, $\beta_P$ and $\beta_N$ indicated by the following equations satisfy a relation of $\beta_P = \beta_N$:

$$\beta_P = \left. \frac{W}{L} \right|_P \mu_P C_o$$

$$\beta_N = \left. \frac{W}{L} \right|_N \mu_N C_o.$$

13. A differential amplifier circuit comprising:

a first differential transistor pair which receives first and second input signals and an output signal as a third input signal;

a second differential transistor pair which receives said first and second input signals and said output signal as a fourth input signal;

an adder section which adds first output signals from said first differential transistor pair and second output signals from said second differential transistor pair; and an amplifying unit which amplifies an addition resultant signal from said adder section to output to said first and second differential transistor pairs, wherein said first differential transistor pair comprises:

first and second P-channel transistors having sources which are commonly connected, gates which respectively receive said first and second input signals, and drains which are commonly connected; and third and fourth P-channel transistors having sources which are commonly connected with said sources of said first and second P-channel transistors, gates which commonly receive said output signal, and drains which are commonly connected, and said second differential transistor pair comprises:

fifth and sixth N-channel transistors having source which are commonly connected, gates which respectively receive said first and second input signals, and drains which are commonly connected; and seventh and eighth N-channel transistors having sources which are commonly connected with said sources of said fifth and sixth N-channel transistors, gates which commonly receive said output signal, and drains which are commonly connected, said first output signals are respectively outputted from said drains of said first and second P-channel transistors and said drains of said third and fourth P-channel transistors, and said second output signals are respectively outputted from said drains of said fifth and sixth N-channel transistors and said drains of said seventh and eighth N-channel transistors, said adder section comprises:

a fourth current mirror circuit which receives said second output signals;

a fifth current mirror circuit which receives said first output signals; and a floating constant current source section connected between said fourth and fifth current mirror circuits, and said amplifying unit is driven based on a third output signal from said fourth current mirror circuit and a fourth output signal from said fifth current mirror circuit to output said addition resultant signal.

14. The differential amplifier circuit according to claim 13, wherein said adder section comprises:

a first current mirror circuit connected with said first differential transistor pair to receive said first output signals;

a second current mirror circuit which is connected with said second differential transistor pair and outputs one of said second output signals to one of transistors of said first current mirror circuit; and a third current mirror circuit which is connected with said second differential transistor pair and outputs the other of said second output signals to the other of said transistors of said first current mirror circuit.

15. The differential amplifier according to claim 14, further comprising:

first and second constant current sources, wherein said first and second P-channel transistors are connected in parallel to each other and said sources of said first and second P-channel transistors are connected with said first constant current source, and said drains of said first and second P-channel transistors are commonly connected with one of transistors of said first current mirror circuit to output one of said first output signals to said one transistor of said first current mirror circuit, said third and fourth P-channel transistors are connected in parallel to each other and said sources of said third and fourth transistors are connected with said first constant current source, and said drains of said third and fourth transistors are commonly connected with the other of transistors of said first current mirror circuit to output the other of said first output signals to said other transistor of said first current mirror circuit, said fifth and sixth N-channel transistors are connected in parallel to each other and said source of said fifth and sixth N-channel transistors are connected with said second constant current source, and said drains of said fifth and sixth N-channel transistors are commonly connected with one of transistors of said second current mirror circuit, and said seventh and eighth N-channel transistors are connected in parallel to each other and said sources of said seventh and eighth N-channel transistors are connected with said second constant current source, and said drains of said seventh and eighth N-channel transistors are commonly connected with one of transistors of said third current mirror circuit, wherein one of said second output signals is supplied from the other transistor of said second current mirror circuit to said other transistor of said first current mirror circuit, and the other of said second output signals is supplied from the other transistor of said third current mirror circuit to said one transistor of said first current mirror circuit.

16. A differential amplifier circuit comprising:

a first differential circuit of a first type which is responsive to first and second input signals and an output signal to convey a first node and a second nodes, wherein said first and second input signals are received by first and second transistors, respectively, and said output signal is received by third and fourth transistors;

a second differential circuit of a second type complementary to said first type which is responsive to said first and second input signals and said output signal to convey a third node and a fourth nodes, wherein said first and second input signals are received by fifth and sixth transistors, respectively, and said output signal is received by seventh and eighth transistors.

17. The differential amplifier circuit according to claim 16, further comprising:

a first current mirror circuit having a first terminal coupled to said second node;

a second current mirror circuit having a first terminal coupled to said third node and having a second terminal coupled to said second node;

a third current mirror circuit having a first terminal coupled to said fourth node and having a second terminal coupled to said first node; and an amplifier coupled to said second node to output said output signal.

* * * * *